United States Patent [19]
Comfort et al.

[11] Patent Number: 5,117,271
[45] Date of Patent: May 26, 1992

[54] LOW CAPACITANCE BIPOLAR JUNCTION TRANSISTOR AND FABRICATION PROCESS THERFOR

[75] Inventors: James H. Comfort; Tze-Chiang Chen, both of Yorktown Heights; Pong-Fei Lu, Peekskill; Bernard S. Meyerson, Yorktown Heights; Yuan-Chen Sun, Katonah; Denny D. Tang, Pleasantville, all of N.Y.

[73] Assignee: International Business Machines Corporation, Armonk, N.Y.

[21] Appl. No.: 624,018

[22] Filed: Dec. 7, 1990

[51] Int. Cl.$^5$ .................. H01L 29/72; H01L 29/34; H01L 29/04; H01L 27/12
[52] U.S. Cl. .......................... 357/34; 357/4; 357/54; 357/56; 357/59
[58] Field of Search .............. 357/4, 34, 54, 56, 59

[56] References Cited

U.S. PATENT DOCUMENTS

| | | | |
|---|---|---|---|
| 4,499,657 | 2/1985 | Ooga et al. | 29/578 |
| 4,504,332 | 3/1985 | Shinada | 148/175 |
| 4,692,786 | 9/1987 | Lindenfelser | 357/54 |
| 4,852,362 | 7/1989 | Suzuki | 357/34 |
| 4,860,078 | 8/1989 | Vaes | 357/34 |
| 4,958,201 | 9/1990 | Mimura | 357/4 |

Primary Examiner—J. Carroll
Attorney, Agent, or Firm—Thomas J. Kilgannon; Blaney B. Harper

[57] ABSTRACT

This invention relates to a bipolar transistor which incorporates, in a raised base regime, an emitter, collector pedestal and intrinsic and extrinsic bases all of which are self-aligned. The invention also relates to a process for fabricating such devices which obtains the self-alignment of the above mentioned elements using a single lithographic and masking step. The structure of the transistor, in addition to having the self-aligned elements, incorporates a composite dielectric isolation layer which not only permits the carrying out of a number of functions during device fabrication but also provides for desired electrical characteristics during device operation. The composite isolation layer consists of an oxide layer adjacent the semiconductor surface; a nitride layer on the oxide layer and an oxide layer on the nitride layer in the final structure of the device. The last mentioned oxide layer starts out early in the fabrication process as a layer of oxidizable material, preferable polycrystalline silicon, which, at later steps in the process, acts as an etch-stop in its unoxidized state and as a memory element and mask in its oxidized state when a self-aligned datum element is removed and the thus exposed underlying dielectric elements must be removed to provide a planar emitter opening. The resulting transistor includes a planar emitter-emitter contact interface which provides for fine control of emitter depth in the underlying intrinsic base region.

20 Claims, 5 Drawing Sheets

LOW CAPACITANCE BIPOLAR JUNCTION TRANSISTOR AND FABRICATION PROCESS THERFOR

FIELD OF THE INVENTION

This invention relates to a bipolar transistor which incorporates, in a raised base regime, an emitter, collector pedestal and intrinsic and extrinsic bases all of which are self-aligned. The invention also relates to a process for fabricating such devices which obtains the self-alignment of the above mentioned elements using a single lithographic and masking step. The structure of the transistor, in addition to having the self-aligned elements, incorporates a composite dielectric layer which not only permits the carrying out of a number of functions during device fabrication but also provides for desired electrical characteristics during device operation. The resulting transistor includes a planar emitter-emitter contact interface which provides for fine control of emitter depth in the underlying intrinsic base region.

The above mentioned composite layer consists of an oxide ($SiO_2$) layer adjacent the semiconductor surface; a nitride ($Si_3N_4$) layer on the oxide layer and an oxide ($SiO_2$) layer on the nitride layer in the final structure of the device. The last mentioned oxide layer starts out early in the fabrication process as a layer of oxidizable material, preferable polycrystalline silicon, which, at later steps in the process, acts as an etch-stop in its unoxidized state and as a memory element and mask in its oxidized state when a self-aligned datum element is removed and the thus exposed underlying dielectric elements must be removed to provide a planar emitter opening. The process results in a high-speed, low capacitance bipolar junction transistor which incorporates a low resistance extrinsic base and a high quality collector/base region.

BACKGROUND OF THE INVENTION

Some of the keys to fabricating a high speed bipolar junction transistor are to not only fabricate a device which is intrinsically fast but also to reduce the parasitic resistances and capacitances associated with that device. Self-aligned structures and semiconductor-on-insulator structures combined with aggressively scaled base width and emitter/base/collector doping profiles represent prior art efforts toward obtaining high-speed bipolar devices and circuits. Recently, low-temperature, high-quality homo or heterojunction epitaxial techniques have significantly advanced the art of emitter-base-collector profile optimization for ever faster intrinsic homo or heterojunction bipolar devices. The prior art, however, has left something to be desired with respect to parasitic resistances and capacitances such as extrinsic base resistance, collector-base and collector-substrate capacitances, etc. which have not been dealt with adequately, especially in structures with very thin base layers formed by low temperature epitaxial deposition methods.

One prior art approach which deals with reducing the capacitance of base-emitter and base-collector junctions and the base resistance is shown in U.S. Pat. No. 4,499,657 initially filed on Feb. 29, 1980. In this patent, a lightly doped silicon layer is epitaxially grown on an oxide film with predetermined openings disposed on one main face of a silicon substrate to form single crystal portions in the openings and polycrystalline portions over the oxide. Ion implantation and thermal annealing are used to convert the polycrystalline portions to opposite conductivity type external base regions and form opposite conductivity internal base regions in the single-crystal portions. Arsenic ions are selectively implanted into the internal base region to form n-conductivity type emitter regions.

The approach of the patent depends on the different rates of dopant diffusion in single-crystal and polycrystalline semiconductor material to form intrinsic and extrinsic base regions. Under such circumstances where ion implantation and annealing are utilized in conjunction with a relatively thick semiconductor layer depth control of the base regions doesn't present a great problem. However, where the layer in which the base is to be formed is relatively thin, other approaches including in situ doping of the upper portion of an epitaxial layer must be used. Without the control provided by such an approach, it is very difficult to control the formation of a thin intrinsic base in which emitter regions must be ultimately formed. Also, in the patent, it is noted that the emitter and base regions are nonself-aligned resulting in the inevitable displacement to one side or the other of the emitter relative to the collector. As a result, link resistance is not readily controlled and is generally larger, by definition, than in a self-aligned structure. In the reference, the extrinsic base is aligned to the edge of the isolation. The intrinsic base should be aligned to the emitter diffusion edge otherwise high base resistance results which degrades switching performance. Thus, the reference patent cannot provide for self-alignment of the emitter and base nor is its fabrication approach susceptible to the fine control required when forming an emitter in intrinsic base regions.

In another prior art approach shown in U.S. Pat. No. 4,504,332 originally filed Sep. 6, 1979, the different rates of diffusion of a dopant in single-crystal and polycrystalline materials are utilized. Also the different oxidation rates of single-crystal and polycrystalline materials are utilized to provide a fully self-aligned bipolar structure. In the patent, a plurality of dielectric layers are used to surround an exposed region of semiconductor in which a subcollector is formed. The uppermost dielectric layer is doped with a p-type dopant. An epitaxial layer of n-type semiconductor material is deposited over the doped oxide where it deposits as polycrystalline material and over the exposed region of semiconductor where it deposits as single-crystal material. An annealing step out-diffuses p-type dopant into the polycrystalline material leaving the single-crystal material n-type. Then an oxidation step forms thin oxide over the single-crystal n-type material and a thick oxide over the polycrystalline regions. An etch step removes only the thin oxide and a p-type intrinsic base is implanted. After this, an n-doped oxide layer is deposited and out-diffused to form the emitter of the device.

The above cited reference relies on high temperature oxidation and annealing steps whereas the present approach utilizes low temperature oxidation in conjunction with in situ intrinsic base doping early in the process to provide good control of the extent of the extrinsic base as well as easy interconnection of the intrinsic and extrinsic bases. Also, the process of the reference is not consistent with the emitter depth requirement of present bipolar devices.

It is, therefore, an object of the present invention to provide a raised base, bipolar transistor in which the emitter, collector pedestal and intrinsic base are all self-aligned.

Another object is to provide a bipolar transistor which incorporates a composite dielectric layer in its final structure and permits the fabrication steps of the transistor to be carried out.

Another object is to provide a method of fabricating a raised base, bipolar transistor in which an oxidizable layer of polycrystalline disposed over oxide-nitride layers carries out many functions in its oxidized and unoxidized states.

Yet another object is to provide a method of fabricating a bipolar transistor in which a single lithographic and masking step permits self-alignment of the emitter, intrinsic and extrinsic bases and collector pedestal.

Yet another object is to provide a method of fabricating a bipolar transistor which provides a device having low base resistance and low capacitance.

These and other features and advantages of the present invention will become more apparent from the following more particular description of the preferred embodiment taken in conjunction with the following briefly described drawings.

BRIEF SUMMARY OF THE INVENTION

Figure 1:
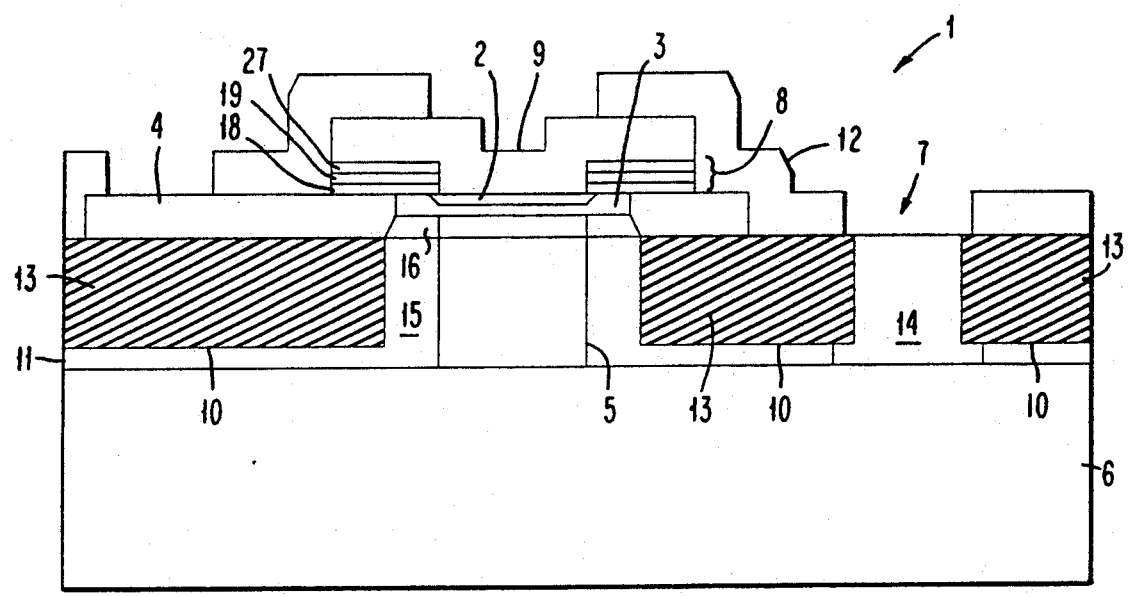
FIG. 1 is a cross-sectional view of a raised base, bipolar transistor in which the emitter, intrinsic base and extrinsic base and collector of the transistor are self-aligned. The transistor includes a plurality of alignment dielectrics which are disposed on planar intrinsic/extrinsic base regions.

The present invention relates to a raised base, bipolar transistor in which the emitter, collector pedestal and intrinsic and extrinsic bases are all self-aligned. In the preferred embodiment, these elements are self-aligned as a result of the presence of a composite dielectric layer which is a key element during fabrication and remains as part of the final structure. The composite layer, in the final structure of the transistor, includes an oxide layer over which nitride and oxide layers are disposed. To the extent that the last mentioned oxide layer carries the datum for self-alignment of the emitter, it cannot be dispensed with and remains as an integral part of the structure. Apart from functioning in oxidized and unoxidized regimes during fabrication, the uppermost layer provides a controllable thickness layer which permits a large measure of control in minimizing device capacitance which should be as small as possible. In the present structure, this is done without severely impacting planarity considerations. In fabricating the structure of the present application, the composite layer is required to perform a number of functions and these layers are introduced after the deposition of a layer of semiconductor material over substrate isolation and single-crystal regions which form polycrystalline and single-crystal regions over isolation and single-crystal regions, respectively. The deposited layer of semiconductor material has an in situ doped upper portion the thickness of which is tightly controlled because it eventually becomes the intrinsic base of the transistor. Thus, after oxide and nitride layers are deposited, a layer of oxidizable polycrystalline silicon is deposited which in its unoxidized and oxidized states will carry out multiple functions not the least of which is the carrying forward of a self-alignment datum which permits self-alignment of the emitter. The initially deposited oxide passivates the surface of the underlying silicon while the nitride layer suppresses oxygen enhanced diffusion and preserves the condition of the epi-poly regions in the in situ doped portion of the epitaxial layer. Apart from these considerations, all the self-aligned elements mentioned above have their self-alignment rooted in a single lithographic and masking step which is aligned symmetrically to the edges of the isolation regions. This step forms an oxide-nitride stack over a single-crystal mesa which acts as a mask during an ion implantation step which form the collector pedestal within a single crystal mesa and in the lower portion of the previously deposited semiconductor layer. After sidewalls are formed on the stack, an ion implantation step forms the extrinsic base. Then, with the polycrystalline portion of the composite layer acting as an etch stop, the sidewall and oxide portion of the stack are removed leaving the nitride portion of the stack. At this juncture, the polycrystalline layer is oxidized. The edges of the oxidized poly butt against the nitride edges and when the nitride is removed, the poly edges carry the datum previously provided by the nitride edges. Subsequent selective etches then expose the planar surface of the doped intrinsic base. A conformal doped poly layer acting as a diffusion source then provides a self-aligned emitter contact with the oxidized polysilicon layer acting as an etch-stop when the poly layer is patterned. The oxidized polysilicon layer then remains in situ to provide the desired minimal capacitance.

DESCRIPTION OF THE PREFERRED EMBODIMENTS

FIG. 1 shows a cross-sectional view of a self-aligned, raised epitaxial, base bipolar transistor which includes a self-aligned emitter, intrinsic base, extrinsic base and collector pedestal. The transistor also includes a composite dielectric layer the edges of which define the emitter opening and its associated contact metallurgy.

FIG. 1 shows a bipolar transistor 1 which includes an emitter 2, an intrinsic base region 3, an extrinsic base region 4, a collector pedestal 5, a subcollector 6, a subcollector reachthrough 7 and a composite dielectric alignment layer 8. Also shown are an emitter contact 9 and trenches 10 which have been formed in a lightly doped epitaxial layer 11 of semiconductor material which has been deposited on substrate or subcollector 6 which is a heavily doped single crystal semiconductor material. Trenches 10 are filled with isolation oxide 13 which surround mesas 14,15. Mesa 14 when heavily doped becomes subcollector reachthrough 7. Mesa 15 forms the collector of transistor 1 which contains collector pedestal 5. In FIG. 1, emitter 2, intrinsic base 3 and a portion of collector pedestal 5 are formed in a deposited semiconductor layer which, when deposited, forms polycrystalline regions over isolation oxide regions 13 and a single crystal region over mesa 15. The upper portion of the deposited layer is doped and, as shown in FIG. 1, forms intrinsic base 3 while the lightly doped (n−) lower portion 16 contains a portion of the collector pedestal 5.

In FIG. 1, extrinsic base 4 is heavily doped and extends from polycrystalline regions into the single crystalline region over mesa 15 and provides contact to intrinsic base 3.

In FIG. 1, emitter contact 9 which is made of heavily doped polycrystalline semiconductor material is shown disposed in contact with emitter 2 which is formed by out-diffusion from the heavily doped polycrystalline semiconductor of emitter contact 9. Composite dielectric layer 8 defines the extent of emitter 2 and thus the active region of the bipolar device. Composite dielectric layer 8 is made of a layer 18 of silicon dioxide disposed on the semiconductor layer which contains intrinsic base 3 and extrinsic base 4; a layer 19 of silicon nitride disposed over layer 18 and a layer 27 of thermally oxidized polycrystalline silicon disposed on layer 19. As shown in FIG. 1, layers 18, 19, 27 are not to scale but have been enlarged in FIG. 1 to emphasize their presence not only as necessary elements in the final structure of transistor 1 but also as necessary elements during the fabrication of transistor 1. As shown in FIG. 1, layers 18, 19, 27 comprise one of the distinguishing features of transistor 1 because, as will be seen hereinbelow, they must be present to achieve the desired result of a transistor with a planar emitter surface, self-aligned base, collector and emitter elements and with low capacitance and low extrinsic base resistance.

In connection with FIG. 1, the various semiconductor elements have only been identified as such and no mention has been made as to the conductivity type of such elements. Suffice it, to state, at this point, that where base 3 is p-conductivity type that emitter 2, collector 5 and subcollector 6 are of n-conductivity type. Also, if base 3 is n-conductivity type, the other elements will be of p-conductivity type. In the discussion of the fabrication of the transistor of FIG. 1, details like dopant used, concentrations, masks and etchants and the like, will be described in somewhat more detail.

Figure 2:
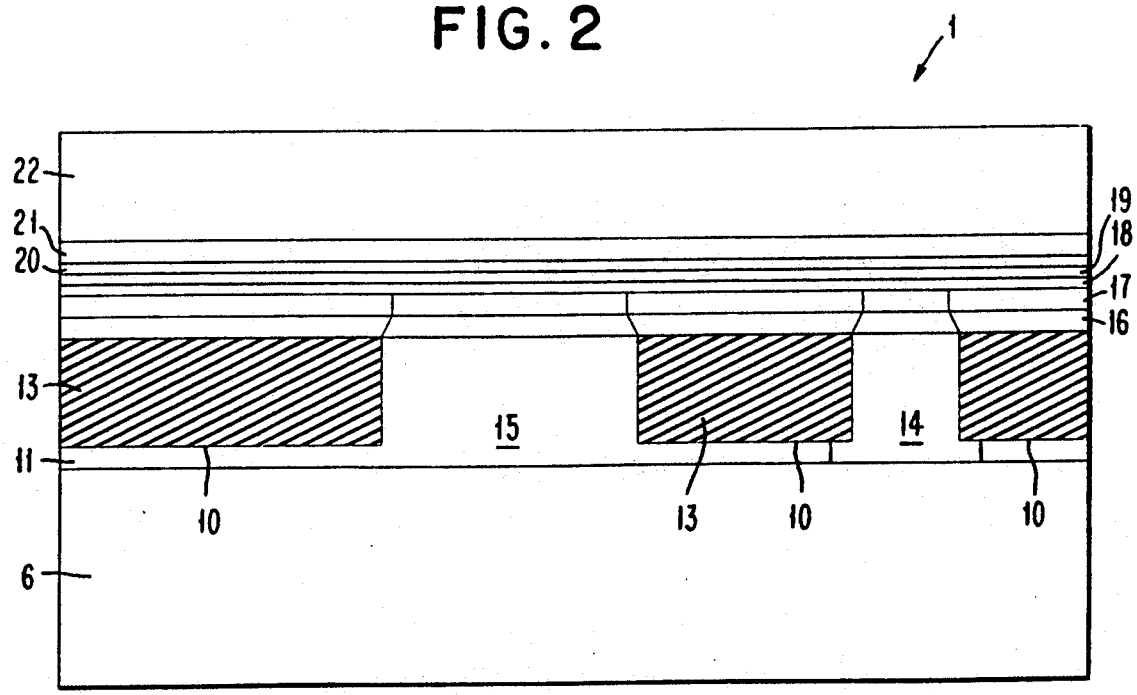
FIGS. 2-10 are cross-sectional drawings of the structure of FIG. 1 at various intermediate stages in its fabrication process.

Referring now to FIG. 2, there is shown a cross-sectional view of the structure of transistor 1 of FIG. 1 at an intermediate stage in its fabrication process. In FIG. 2, a plurality of trenches 10 have been formed in a lightly doped (n−) epitaxial layer 11 of silicon semiconductor material which has been deposited on a heavily doped (n+) single crystal silicon semiconductor subcollector or substrate 6. Trenches 10 have been filled with an isolation oxide 13. Oxide 13 has been fabricated using well-known conformal oxide deposition and oxide polishing steps or other methods to bring the surface of oxide 13 to the same level as the surface of epitaxial layer 11. At this point, the rightmost upstanding portion or mesa 14 of layer 11 in FIG. 2 is subjected to an ion-implantation step which renders it heavily doped to the same concentration and conductivity type as substrate 6. The ion-implantation is carried out using well-known lithographic and implantation steps. Upstanding portion or mesa 14 of layer 11 will ultimately form the subcollector reachthrough to substrate 6 which is the subcollector of the device of FIG. 1. Leftmost upstanding portion or mesa 15 of layer 11 will ultimately form the collector of the bipolar device of FIG. 1 and will contain a self-aligned collector pedestal 5.

After the ion-implantation of mesa 14, a layer of silicon semiconductor material is deposited on the surfaces of mesas 14,15 and on isolation oxide 13 using a nonselective epitaxial deposition technique. The layer deposits as a polycrystalline material on the oxide 13 and as single crystal material on the surfaces of mesas 14,15.

The thus deposited silicon layer consists of an undoped portion 16 and a p-type conductivity doped portion 17. The latter portion, as will be seen in what follows, will form the intrinsic base of the device of FIG. 1. The total thickness of portions 16,17 is determined by the amount of polycrystalline silicon required in extrinsic base 4 to provide a low resistance contact to the intrinsic base 3. The use of a layer made up of portions 16,17 renders the structure of FIG. 1 useful for any arbitrarily thin intrinsic base. In the foregoing, a layer of silicon/germanium may be used as an alternative to silicon. Portions 16,17 may be deposited using any well-known epitaxial deposition technique which provides the desired polycrystalline and single crystal regions over oxide region 13 and mesas 14,15, respectively. Layers 16,17 may be may be deposited sequentially in a single deposition step or in two separate depositions. A preferred approach is to deposit portions 16,17 using a low temperature epitaxial (LTE) technique. Such an LTE technique is described in an article in Journal of the Electrochemical Society: Solid-State Science and Technology, Vol. 133, No. 6, page 1232, June 1986, entitled "Low Temperature Silicon Epitaxy by Hot Wall Ultrahigh Vacuum/Low Pressure Chemical Vapor Deposition Techniques: Surface Optimization" by B. S. Meyerson et al and is incorporated herein by reference. In the present process, boron may be used as the p-conductivity type dopant and may have a doping concentration of $5 \times 10^{18} - 5 \times 10^{19}$ cm$^{-3}$. In this way, portion 17 of the deposited layer is formed of boron doped silicon or silicon/germanium by simply introducing the appropriate constituents during the deposition step in a well-known way.

Where silicon/germanium (SiGe) is used instead of silicon, the SiGe base device has a higher emitter injection efficiency and thus less emitter charge storage for a given bias relative to a silicon base device. In addition, grading the germanium concentration in the base region provides a built-in electric field (drift-field) which reduces the transist time of minority carriers across the neutral base. In a typical device, one may expect an emitter junction depth 25 nm below polycrystalline-monocrystalline interface and a base-collector junction 60 nm below that. A corresponding germanium profile would begin grading the germanium concentration at the base-emitter junction and ramp it up to roughly 8-10% over 300 Angstroms to provide a drift field over the heavily doped region of the intrinsic base profile. The germanium contact would then be held at the 8-10% level for 350 Angstroms so that it extends just past the metallurgical base-collector junction. At this point, the germanium content is reduced 60% over less than 100 Angstroms and the remaining material is all silicon. Of course, other Ge profiles may be used as well depending on specific device designs.

In FIG. 2, semiconductor substrate 6, layers 11, 16 and 17 are all preferably made of silicon semiconductor material. However, it should be appreciated that the teaching of the present application is not limited to silicon and that other semiconductor materials like gallium arsenide may also be used. Also, in FIG. 2, the doped semiconductor regions such as substrate 6 and mesas 14,15 are of n-conductivity type but these same regions may equally well be of p-conductivity type without departing from the spirit of the present invention. To the extent various regions have been characterized as heavily doped (n+, n++) or lightly doped (n−), such designations do not depart from well-known practices in the fabrication of semiconductor devices. Thus, n+ may represent a dopant concentration of $10^{19} - 10^{20}$ cm$^{-3}$, n++ may represent a concentration of the same dopant of $10^{21}$ cm$^{-3}$, n− may represent a concentration of $10^{15}$–$10^{16}$ cm$^{-3}$ and n may represent a concentration of $10^{17}$–$10^{18}$ cm$^{-3}$. Typical n-conductivity type dopants are phosphorous, arsenic and antimony.

After the deposition of portions 16,17, layers of oxide 18, nitride 19, polysilicon 20, nitride 21 and oxide 22 are formed over portion 17. All of the foregoing layers are deposited in manners well-known to those skilled in the semiconductor fabrication art. Oxide layer 18, however, may be thermally grown using well-known prior art techniques provided oxidation takes place under conditions which do not lead to excessive diffusion of intrinsic base dopant in layer 17. A good choice would be to oxidize at low temperature (500°–700° C.) with 1–10 atm for oxidizing ambient in order to minimize boron diffusion and afford adequate junction depth control. For exemplary purposes, layers 18,19 have thicknesses of 10 nm each, layer 20 has a thickness of 30 nm, layer 21 has a thickness of 50 nm and layer 22 has a thickness of 400 nm. The layers are present for various reasons. For example, oxide layer 18 passivates the surface of silicon portion 17 while nitride layer 19 suppresses oxygen enhanced diffusion and preserves the condition of the epi-poly regions in portion 17. In addition, layer 19 prevents oxidation of polysilicon regions of portion 17 in which the extrinsic base will be formed keeping its resistance low.

Figure 3:
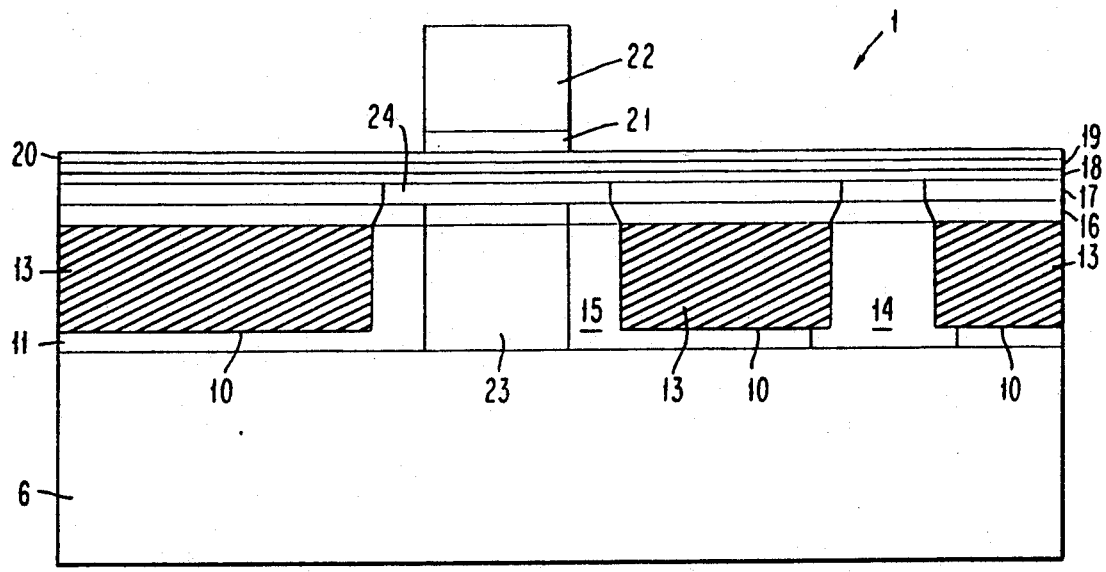

Referring now to FIG. 3, there is shown a cross-sectional view of the structure of FIG. 1 at a still later intermediate stage in its fabrication process. As shown, FIG. 3 includes an oxide-nitride masking stack 22–21 disposed over layers of oxide 18, nitride 19 and polysilicon 20. The last mentioned layers are formed over portion 17 of the deposited silicon semiconductor layer which contains both single crystal and polycrystalline regions. In FIG. 3, the oxide-nitride stack 22–21 is formed over mesa 15 and regions of portions 16,17, all of which are single crystal semiconductor materials.

Before describing FIG. 3 in detail, it should be appreciated that all of the regions of the device of FIG. 1 which are self-aligned depend on the novel approach shown in FIG. 3 and result from a single lithography step which is carried out in conjunction with a dual purpose, oxidizable masking layer 20 which, in its unoxidized state, acts as an etch-stop when the oxide-nitride stack 22–21 is being formed and when, in subsequent steps, oxide sidewalls and the oxide portion 22 of the oxide-nitride stack 22–21 are removed to leave only the nitride portion 21 of the stack. The dual purpose masking layer 20, in its oxidized state retains or remembers the positioning of the nitride portion 21 of the nitride-oxide stack 22–21 so that, when the nitride 21 is finally removed, the edges of the now oxidized portions of layer 20 define a self-aligned aperture which ultimately defines emitter region 2. The region of layer 20 underneath remaining portions of layers 22–21 are not oxidixed. From the foregoing, it should be clear that the introduction of a dual-purpose oxidizable masking layer is a key-step because its presence, as will be seen in the detailed description hereinbelow, permits a single lithography step to be used which self-aligns a collector implant and an extrinsic base implant relative to an emitter opening. In what follows, the oxidizable masking layer 20 will preferably be polycrystalline silicon but any material may be used which, in its unoxidized state, acts as an etch-stop during the removal of oxide and nitride materials and, in its oxidized state, acts as a mask for the removal of nitride while simultaneously retaining the position of the nitride. The simple expedient of providing such a layer with its oxidizable characteristic permits functioning in at least two regimes which take into consideration both present and future steps in the process as will be seen in what follows.

Considering now FIG. 3 in detail, an intermediate structure is shown after a single photolithograph masking and etching step has been carried out and a self-aligned collector pedestal has been implanted. Using a photoresist which is spun on the surface of oxide layer 22, a mask patterns the photoresist such that, upon development, a photoresist mask is positioned over mesa 15 symmetrically with respect to the edges of mesa 15 using known photolithographic techniques. Then, using a Reactive Ion Etching (RIE) step, portions of oxide layer 22 and nitride layer 21 are removed everywhere except under the photomask leaving an oxide-nitride stack 22–21. This etch must completely remove nitride from the surface of polysilicon layer 20 such that it may be completely and uniformly oxidized at a later point in the process. A typical etch chemistry maybe $CHF_3/Ar$ followed by a $CF_4/CO_2$ selective finish. At this point, an additional isotropic wet etch step may be used to provide a slight undercut (not shown) of nitride 21 providing what will ultimately be an emitter region of smaller area than if nitride 21 were not undercut. In carrying out the RIE step, polysilicon layer 20 in its unoxidized state acts as an etch-stop when nitride layer 21 is etched. If polysilicon layer 20 were not present, etching of nitride layer 19 would also occur exposing oxide layer 18 to removal when similar oxide material used as a sidewall is etched in a subsequent step. Also, if polysilicon layer 20 were not present when nitride 21 is removed in a subsequent etching step, nitride layer 19 would also be removed and the positioning of nitride 21 would be lost spoiling the previously established self-alignment. After etching layers 21,22, the photoresist mask is stripped and the device is subjected to an ion-implantation step which implants an n-conductivity type material like phosphorous into mesa 15 and some of portion 16 under the oxide nitride stack 22–21. The height of oxide-nitride stack 22–21 controls the depth of the implant in mesa 15 and portion 16 which is doped n-conductivity type. The ion-implantation step forms a self-aligned collector pedestal 23 in mesa 15 and portion 16 which is self-aligned to the edges of oxide 22. Pedestal 23 is more heavily doped than the remaining portions of mesa 15 and portions 16 which are lightly doped or n$^-$-conductivity type. The lightly doped (n$^-$) regions of mesa 15 and portions 16 are present to avoid capacitance effects which might arise from high doping levels at what will become the extrinsic base-collector junction of the device of FIG. 1. At this point in the fabrication process, only collector pedestal 23 has been formed with a p-doped expitaxial region 24 of portion 17 disposed over pedestal 23 the width of which will be defined in a self-aligned manner in subsequent steps to form intrinsic base 3.

In the description of FIG. 3, the deposition, masking, etching and ion-implantation steps have been described in only general terms since each of these steps does not depart in anyway from similar steps well-known to practitioners in the semiconductor fabrication arts. All of these steps can be carried out using apparatus and materials which are commercially available.

Figure 4:
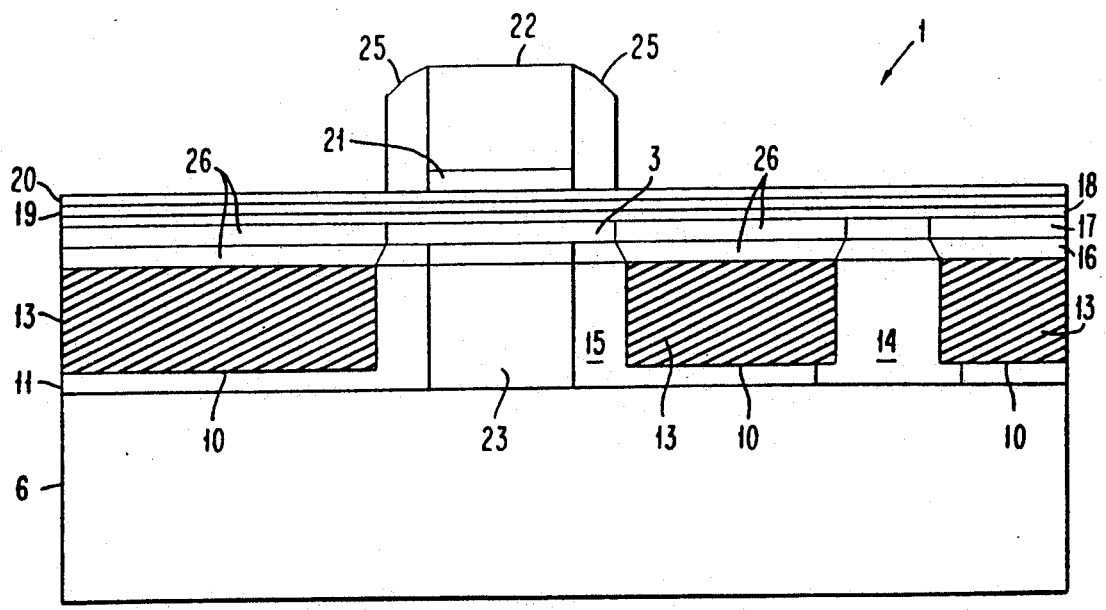

FIG. 4 is a cross-sectional view of the structure of FIG. 3 after it has been subjected to sidewall formation and an extrinsic base ion-implantation step.

In FIG. 4, sidewalls 25 are formed by conformally depositing a layer of silicon dioxide over polysilicon layer 20 and oxide 22 of the oxide-nitride stack 22-21. The silicon dioxide layer is deposited in a well-known manner to a desired thickness which will ultimately determine the width of sidewalls 25. After deposition of the silicon dioxide layer, it is subjected to a Reactive Ion Etch (RIE) step which removes silicon dioxide from the surface of polysilicon layer 20 (which acts as an etch-stop) and from the top of oxide-nitride stack 22-21 leaving sidewalls 25 as shown in FIG. 4. The RIE step is well-known to those skilled in the semiconductor fabrication art so it is not discussed in detail here.

Once sidewalls 25 have been formed with a selected width, the structure is subjected to an ion-implantation step which forms extrinsic base regions 26. Extrinsic base regions 26 are heavily doped with a p-type conductivity dopant like boron. The boron implantation may be preceded by a pre-amorphization implant using any of heavy ions (Si, Sn, Sb, In, Ge) to reduce boron channelling and allow for damage base regrowth after implantation. Regions 26 may also be characterized as being doped to a p++ concentration. In considering the structure of FIG. 4, it should be appreciated that the width of oxide 22 has remained fixed since its original formation and is the datum against which all self-alignments are measured. To the extent sidewalls 25 have a known and controllable thickness, these thicknesses plus the width of oxide 22 can be considered to provide accurately spaced extrinsic base regions 26 which may also be characterized as self-aligned. It should be noted that in FIG. 4, polysilicon layer 20 is still in its unoxidized state and acts as an etch-stop when the removal of the silicon dioxide is complete. To the extent extrinsic base regions 26 have been defined by the ion-implantation step, portion 17 which has been previously doped with boron and which is masked by and lies under the oxide-nitride stack 22-21 and sidewalls 25, the same implantation step defines intrinsic base 3 of transistor 1 of FIG. 1 in what was formerly region 24 in FIG. 3.

Figure 5:
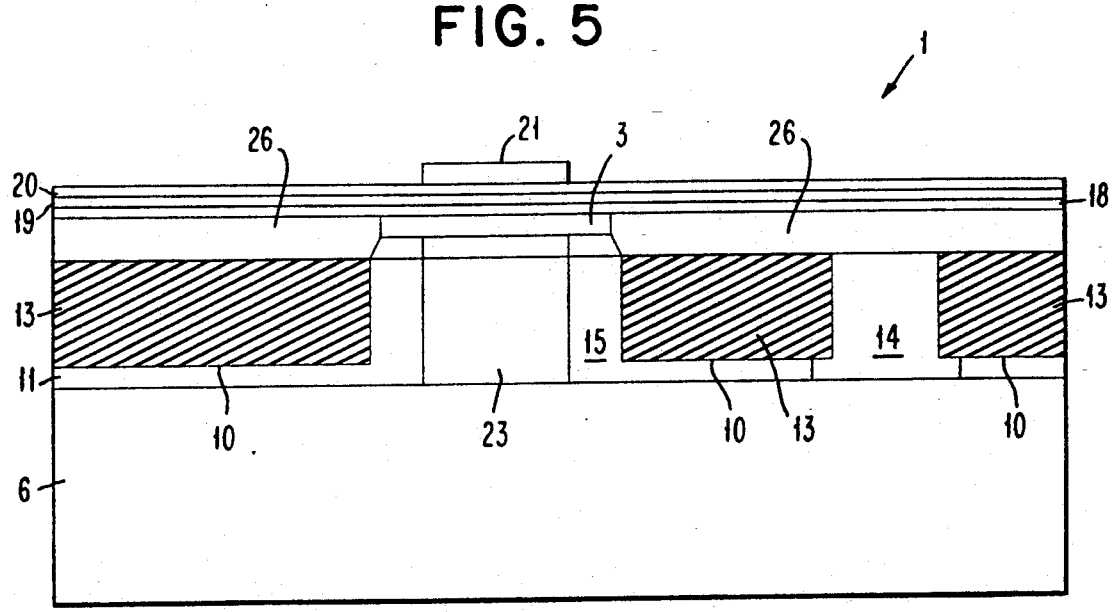

Referring now to FIG. 5, there is shown therein a cross-sectional view of the structure of FIG. 4 from which oxide 22 of oxide-nitride stack 22-21 has been removed. After implanting extrinsic base regions 26, sidewalls 25 and oxide 22 are removed using a dip-etch step which selectively attacks silicon dioxide but not nitride 21 or polysilicon layer 20. Again, it should be noted that polysilicon layer 20 is in its unoxidized state and continues to act as an etch-stop. At this juncture, nitride 21 is the datum against which all further self-alignment steps will be measured. If, at this point, nitride 21 were used as a mask to etch polysilicon layer 20 leaving a polysilicon-nitride stack, the underlying nitride layer 19 would be exposed. Then, when nitride 21 is removed, nitride layer 19 would also be attacked effectively destroying the datum provided by nitride 21. This undesired result is eliminated by oxidizing polysilicon layer 20 as shown in FIG. 6.

Figure 6:
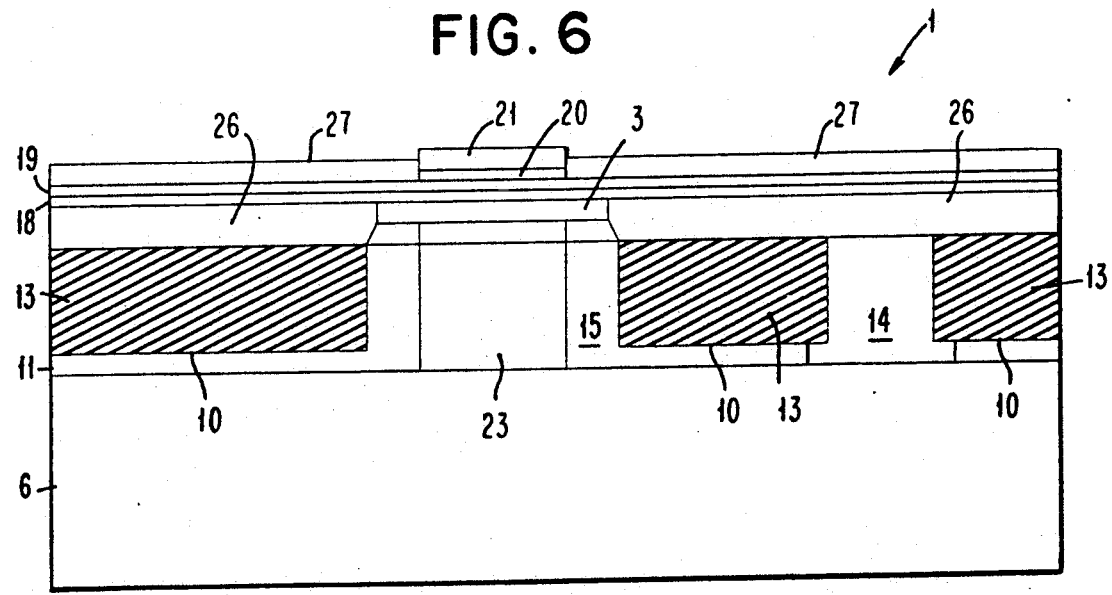

FIG. 6 is a cross-sectional view of FIG. 5 after polysilicon layer 20 has been subjected to a well-known thermal oxidation step. By thermally oxidizing polysilicon layer 20, all of that layer except the portion masked by nitride 21, is converted to silicon dioxide regions 27. In order to provide adequate control of dopant diffusion, oxidation should again be carried out at as low a temperature as possible. Nitride layer 19 serves as an oxidation stop and prevents oxidation enhanced diffusion of both intrinsic and extrinsic base regions as discussed above. The 30 nm of polysilicon is converted into 60 nm of silicon dioxide. It should be noted that silicon dioxide regions 27 butt up against the edges of nitride 21 and against the edges of what remains of polysilicon layer 20, in effect, transferring the datum of the edges of nitride 21 to the edges of silicon dioxide regions 27. Thus, in its oxidized state, polysilicon layer 20 retains the datum for further self-alignment of the device emitter and contact therefor. In addition, as will be seen in what follows, silicon dioxide regions 27 act as masks when the remainder of polysilicon layer 20 is removed.

Figure 7:
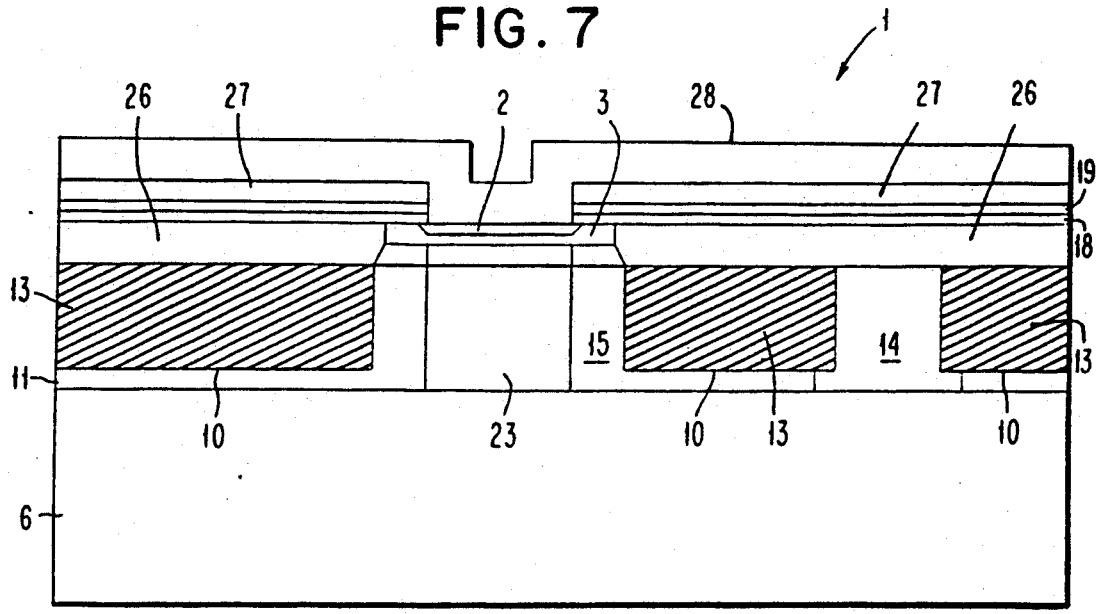

FIG. 7 is a cross-sectional view of the device of FIG. 6 after nitride 21, the remains of polysilicon layer 20 and a portion of layers 19 and 18 have been removed. After the thermal oxidation step discussed in connection with FIG. 6, nitride 21, layer 20, nitride layer 19 and oxide layer 18 are subjected to successive selective etching steps which expose a portion of the surface of the layer which contains the single crystal intrinsic base 3. Thus, nitride 21 is removed by subjecting it to a hot phosphoric (H$_3$PO$_4$) acid dip-etch with silicon dioxide regions 27 acting as masks. Alternatively, nitride 21 may be removed by RIE using CF$_4$/CO$_2$ as an etchant. The remainder of polysilicon layer 20 may be removed by dip-etching in KOH or by plasma etching in HBr-Cl$_2$-He-O$_2$, HCl-O$_2$-Ar, in CF$_2$ or SF$_6$ in a well-known manner. A portion of nitride layer 19 is then removed by RIE using CF$_4$/CO$_2$ while regions 27 act as masks. Finally, the surface of base 3 is exposed using a wet etch like dilute hydrofloric acid (HF) with regions 27 acting as masks as shown in FIG. 7. Base 3 under its exposed surface will contain the device emitter 2 which is self-aligned with the underlying collector pedestal implant 23. Once the surface of base 3 is exposed, a layer 28 of n+-conductivity type polycrystalline silicon is conformally deposited over the surface of oxide layer 27 and on the exposed surface of base 3. Layer 28 is then subjected to a thermal drive-in step which causes n-type dopant to out-diffuse into the p-type conductivity intrinsic base 3 forming n-type conductivity emitter 2 therein. The latter is now self-aligned with collector pedestal 23 and intrinsic base 3. All the above described steps involved in forming the emitter region, in carrying out selective dip etches, in conformally depositing, in out-diffusing and the like are all steps well-known to skilled practitioners in the semiconductor fabrication art and do not depart in any way from such steps.

Figure 8:
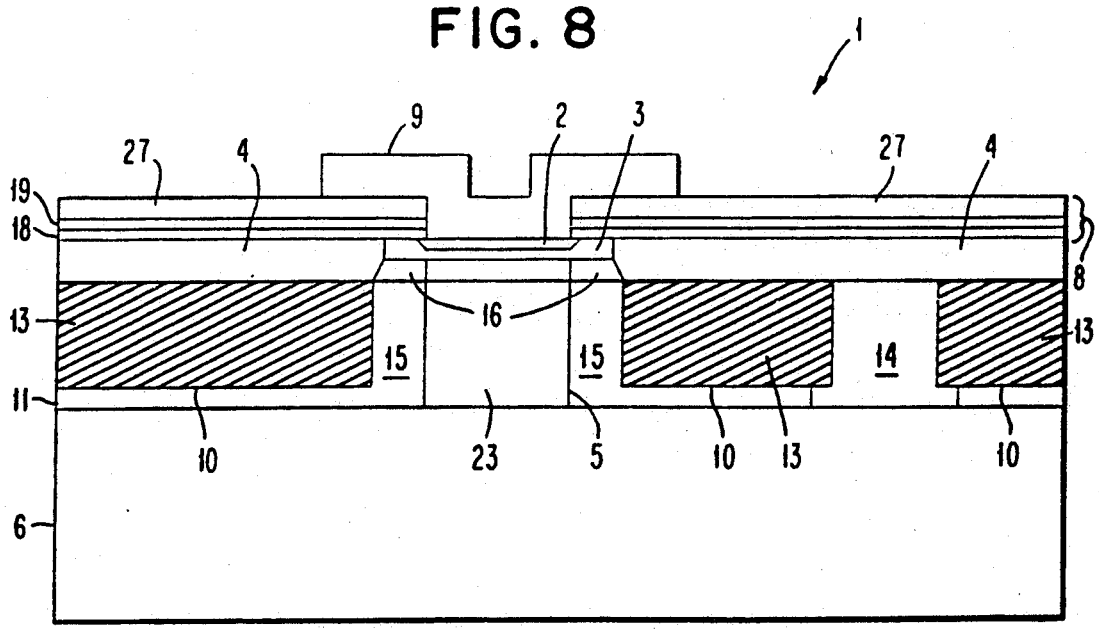

FIG. 8 is a cross-sectional view of the structure of FIG. 7 after the formation of an emitter contact.

Once polycrystalline layer 28 has been deposited and emitter 2 has been formed, layer 28 may be masked and etched in a well-known way to form emitter contact 9. FIG. 8 shows layers 18, 19 and regions 27 out of scale to emphasize the fact that they remain in the final structure. Again, it should be noted that regions 27 act as etch-stops when layer 28 is being patterned. It should also be appreciated that thermal oxide regions 27 have now fulfilled their function of acting as masks in etching the underlying dielectrics and, while so doing, have also carried forth, in the positioning of their edges, the datum which was originally contained in nitride 21 of oxide-nitride stack 22-21 permitting self-alignment of emitter 2 and emitter contact 9. Apart from their function during fabrication, regions 27 carry out the electrical function of minimizing the emitter-base capacitance of transistor 1 during operation, while at the same time, nitride 19 preserves the extrinsic base resistance. To accomplish this, a certain thickness of composite layer 8 is required which provides for such thickness but is, at the same time, not so thick as to impact planarity considerations. To extent this thickness must be controllable, the initial polycrystalline character of layer 27, upon thermal oxidation, determines its final thickness and can be readily adjusted. From all the foregoing, it should be clear that composite layer 8 must be present in the final structure to achieve self-alignment of certain elements during fabrication and desired electrical characteristics during operation.

Figure 9:
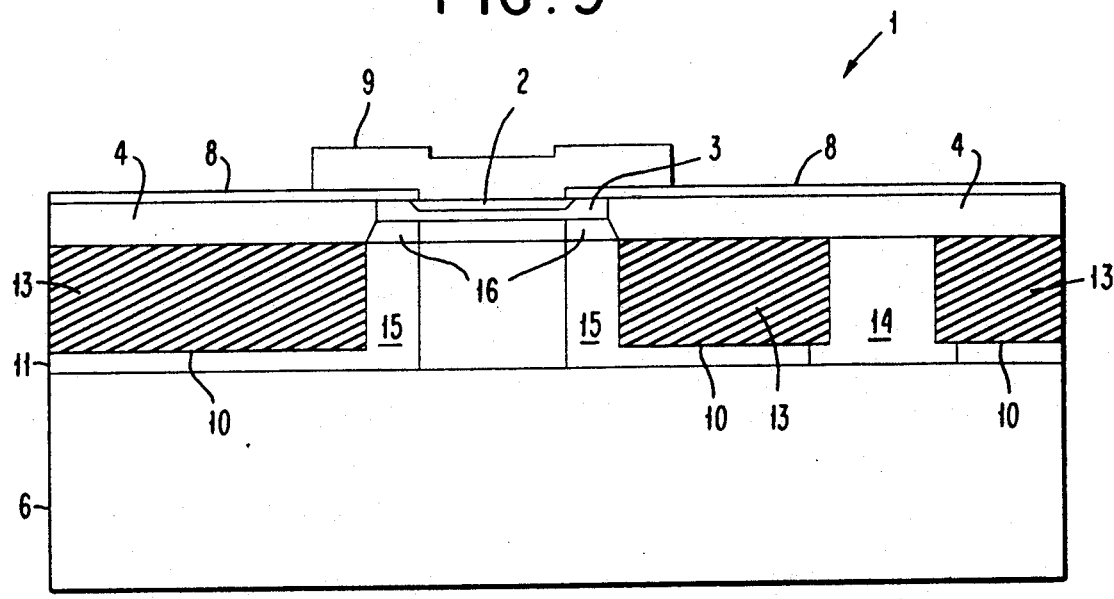

Referring now to FIG. 9, there is shown a cross-sectional view of the structure of FIG. 8 except that the composite dielectric layer 8 is shown as a single layer to provide a better idea of the thicknesses involved when all the elements are shown approximately to scale.

Figure 10:
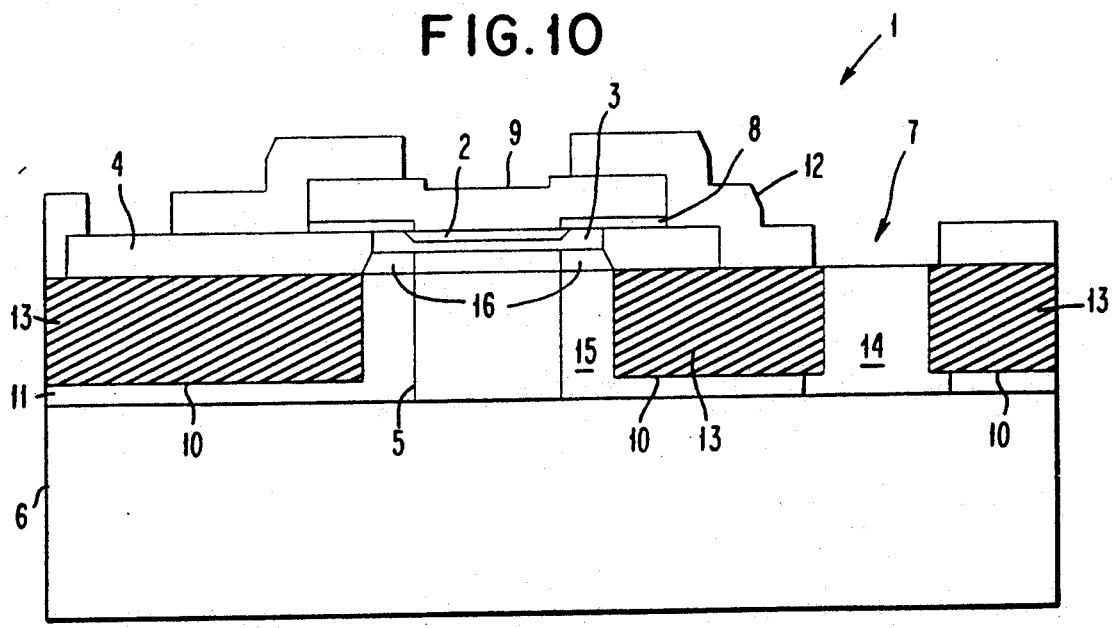

Finally, FIG. 10 shows a cross-sectional view of the structure of FIG. 1 except that composite layer 8 has been substituted for dielectric layers 18,19,27 of FIG. 1 to provide a better representation of the true scale of the elements involved.

After the emitter contact is formed, emitter, base and collector contact holes may be formed in overlying insulation providing a final structure having a configuration like that shown in FIGS. 1 and 10.

The self-aligned epitaxial base transistor structure depicted in FIG. 1 has been fabricated using Si and SiGe base transistors and has the following typical parameters. The resulting transistors have low emitter resistance (20 $\Omega\mu m^2$) and low extrinsic base resistance ($R_{bx}=60\Omega$). Nearly ideal IV characteristics were obtained indicating that sufficient emitter-base separation and isolation were achieved using the disposable sidewall approach described in the preferred embodiment. Typical emitter junction depths and metallurgical basewidths achieved are approximately 25 nm and 60 nm, respectively. Lower emitter junction depths and basewidths of roughly 17 nm and 30 nm may also be achieved in the same structure through use of dielectrics deposited at low temperatures for layer 17,18,19 and low temperature oxidation (HIPOX). Devices with Si/Ge bases contained a graded SiGe profile within the metallurgical base as required to enhance both DC and AC performance. The AC performance of the discrete devices are characterized by unity gain cutoff frequencies ($f_T$) in the 30-50 GHz and 50-70 GHz range for Si and SiGe, respectively, when working with intrinsic base sheet resistances on the order of 5-10 kOhm/square but is by no means limited to this range. The overall utility of the technology has been further demonstrated through fabrication of ECL (Emitter Coupled Logic) ring oscillators with unloaded gate delays below 25 ps/gate.

Using the above described process, a structure like that shown in FIG. 10 can be provided. In particular and on a local level, the fact that a planar surface can be provided at the emitter opening permits fine control of the emitter depth when the emitter region is being diffused. In a similar vein, planar contact surfaces for the base and collector contacts are also provided. On another level, the process dislcosed minimizes total step height so that etching is simplified during contact formation and metallization. All the foregoing benefits have been provided using the process decribed herein while simultaneously providing self-alignment of the emitter, collector pedestal, intrinsic base and extrinsic base and very precise control of junction depths and positioning in Si or SiGe on a sub 10 nm scale.

Having thus described our invention what we claim as new and desire to secure as Letters Patent, is:

1. A self-aligned epitaxial base bipolar transistor comprising a semiconductor substrate of a first conductivity type a first epitaxial layer of semiconductor material of said first conductivity type disposed over said substrate having single crystal and recessed oxide regions therein said regions having planar surface portions said single crystal region containing a portion of a collector pedestal spaced from said recessed oxide regions, a second planar, epitaxial layer of semiconductor material disposed over said first layer having a single crystal region disposed over said single crystal surface portion and polycrystalline regions over said recessed oxide surface portions said single crystal region containing an intrinsic base region, an emitter region and another portion of said collector pedestal said pedestal being bounded by an edge and said polycrystalline regions containing extrinsic base regions, and, a planar composite isolation layer containing an aperture disposed on said second layer comprised of at least two different dielectric materials the uppermost of which is made of oxidized material of given thickness said aperture being bounded by an edge said edge of said aperture being self-aligned with said edge of said collector pedestal, said planar cpmposite layer providing emitter-base isolation and the thickness of said oxidized material determining the emitter-extrinsic base capacitance of said transistor.

2. A transistor according to claim 1 wherein said semiconductor substrate is made of silicon.

3. A transistor according to claim 1 wherein said first epitaxial layer is made of silicon.

4. A transistor according to claim 1 wherein said second layer has a doped upper portion and is made of a silicon.

5. A transistor according to claim 1 wherein said second layer has a doped upper portion and is made of a silicon-germanium alloy.

6. A transistor according to claim 1 wherein said composite isolation layer further includes a layer of silicon nitride sandwiched between said oxidized layer and another oxide layer which is disposed on said second layer.

7. A transitor according to claim 1 wherein said oxidized material is thermally grown silicon dioxide.

8. A transistor according to claim 1 wherein said first conductivity type is n-conductivity type.

9. A transistor according to claim 1 wherein said first conductivity type is p-conductivity type.

10. A transistor according to claim 1 wherein said intrinsic and extrinsic base regions are of a second conductivity type and said emitter region and said portion of said collector pedestal are of said first conductivity type.

11. A transistor according to claim 1 further including another portion of said collector pedestal disposed in said first layer in registry with said portion of said collector pedestal said another portion being of said first conductivity type.

12. A transistor according to claim 1 further including an emitter contact disposed within said aperture.

13. A transistor according to claim 4 wherein said doped upper portion is of second conductivity type.

14. A transistor according to claim 5 wherein said doped upper portion is of second conductivity type.

15. A transistor according to claim 6 wherein said another oxide layer is silicon dioxide.

16. A transistor according to claim 10 wherein said first conductivity type is n-type and said second conductivity type is p-type.

17. A transistor according to claim 10 wherein said first conductivity type is p-type and said second conductivity type is n-type.

18. A transistor according to claim 11 wherein said first conductivity type is n-type.

19. A transistor according to claim 11 wherein said first conductivity type is p-type.

20. A transistor according to claim 12 wherein said emitter contact is heavily doped polycrystalline silicon.

* * * * *